United States Patent
Watanabe

(10) Patent No.: US 7,386,650 B2
(45) Date of Patent: Jun. 10, 2008

(54) MEMORY TEST CIRCUIT WITH DATA EXPANDER

(75) Inventor: Mitsuaki Watanabe, Chiba (JP)

(73) Assignee: Oki Electric Electric Industry Co., Ltd. (JP)

( * ) Notice: Subject to any disclaimer, the term of this patent is extended or adjusted under 35 U.S.C. 154(b) by 402 days.

(21) Appl. No.: 10/769,864

(22) Filed: Feb. 3, 2004

(65) Prior Publication Data

US 2004/0181637 A1 Sep. 16, 2004

(30) Foreign Application Priority Data

Mar. 14, 2003 (JP) ............................. 2003-069366

(51) Int. Cl.
*G06F 12/00* (2006.01)

(52) U.S. Cl. ..................... 711/2; 711/212; 714/720

(58) Field of Classification Search ............... 714/718, 714/30, 719; 710/66, 300, 307, 313; 711/2, 711/212; 700/31, 81; 365/201; 379/26.02

See application file for complete search history.

(56) References Cited

U.S. PATENT DOCUMENTS

| | | | | |
|---|---|---|---|---|
| 5,663,965 | A * | 9/1997 | Seymour | 714/726 |
| 5,852,618 | A * | 12/1998 | Fujisaki | 714/738 |
| 6,324,666 | B1 * | 11/2001 | Nakamoto | 714/736 |
| 6,622,272 | B1 * | 9/2003 | Haverkamp et al. | 714/725 |
| 6,701,470 | B1 * | 3/2004 | Mullarkey et al. | 714/718 |
| 6,754,865 | B2 * | 6/2004 | Haraguchi | 714/736 |
| 2001/0015924 | A1 * | 8/2001 | Arimoto et al. | 365/201 |
| 2002/0021305 | A1 * | 2/2002 | Cheng | 345/658 |
| 2002/0069383 | A1 * | 6/2002 | Ni | 714/720 |
| 2003/0140072 | A1 * | 7/2003 | Hoskote | 708/1 |

FOREIGN PATENT DOCUMENTS

| | | |
|---|---|---|
| JP | 2000-357372 | 12/2000 |
| JP | 2001-184899 | 7/2001 |
| JP | 2001-319500 | 11/2001 |
| JP | 2002-108641 A | 4/2002 |
| JP | 2002-157900 | 5/2002 |
| JP | 2003-346500 A | 12/2003 |

OTHER PUBLICATIONS

Office Action dated Sep. 4, 2007 issued by the Japanese Patent Office in corresponding application No. 2003-069366.
Office Action in Japanese Counterpart Patent Application No. 2003-069366 dated Dec. 11, 2007.

* cited by examiner

*Primary Examiner*—Donald Sparks
*Assistant Examiner*—Matthew Bradley
(74) *Attorney, Agent, or Firm*—Studebaker & Brackett PC; Donald R. Studebaker

(57) ABSTRACT

A memory test circuit receives test pattern data from a processing unit having a first data width, expands the test pattern to a second data width greater than the first data width, and writes the expanded test pattern data into a memory having the second data width, thereby avoiding the need for extra write cycles when a processing unit tests a memory having a greater data width. The test pattern data may be expanded by, for example, copying a specific bit to multiple bit positions, inverting a specific bit and copying the inverted bit to multiple bit positions, or performing arithmetic operations that generate a test pattern similar to the test pattern received from the processing unit.

1 Claim, 3 Drawing Sheets

MEMORY TEST CIRCUIT WITH DATA EXPANDER

BACKGROUND OF THE INVENTION

1. Field of the Invention

The present invention relates to a memory test circuit enabling a central processing unit (CPU) to test a memory having a data width greater than the data width of the data bus linking the memory to the CPU.

2. Description of the Related Art

So-called system-on-a-chip devices, for example, are often structured to transfer data directly between memory and peripheral computational circuits on a wide data bus, without the intervention of the CPU. One example of such a device is described in Japanese Patent Application Publication No. 2000-357372. When the device is fabricated, it is tested by having the CPU execute a self-test program. As part of the self-test, the CPU must write test patterns in the memory, so a memory test circuit, which is a type of switching circuit that connects the memory to the CPU, is provided. If the width of the CPU data bus is less than the data width of the memory, the memory test circuit must also convert the data width.

FIG. 1 schematically shows a conventional memory test circuit. This memory test circuit tests a memory (MEM) 1 having an m-bit data width by using a CPU 2 having an n-bit data bus (m>n). To convert between m-bit and n-bit data, the circuit includes an m-bit register (REG) 3, L n-bit registers $4_1, 4_2, \ldots, 4_L$ (where L is the least integer equal to or greater than m/n), and a selector (SEL) 5. Register 3 is coupled between the data input-output terminals of the memory 1 and registers $4_1$-$4_L$. Registers $4_1$-$4_L$ are coupled in parallel to the data bus of the CPU 2. Selector 5 selects n-bit portions of the data stored in register 3 and supplies the selected data to the CPU 2.

In this type of memory test circuit, an m-bit word of data written into the memory 1 is first written from the CPU 2 into registers $4_1$-$4_L$ as separate n-bit portions of write data WDT, requiring L write cycles; then the n-bit portions of write data are transferred all at once through register 3 into the memory 1. Similarly, m-bit data read from one word in the memory 1 are stored in register 3 temporarily, and the stored data are divided into n-bit portions in selector 5 and sequentially supplied to the CPU 2 as read data RDT. Accordingly, even though the memory 1 can input or output m bits per cycle, each reading or writing operation requires (L+1) cycles.

In, for example, a memory test using the marching cubes algorithm (a specific procedure for which will be given later), a total of ten test cycles, including six write cycles and four read cycles, are inherently necessary for each word in the memory 1. In the memory test circuit described above, (L+1) times as many cycles are required; that is, 10(L+1) cycles are required. Even in a simpler memory test using a checker pattern or the like, that inherently requires only four cycles (two write cycles and two read cycles) per word, 4(L+1) cycles are needed, and in a memory test using a diagonal pattern, 2(L+1) cycles are required for writing and reading.

The conventional memory test circuit described above is problematic because the test data must be written from the CPU 2 into registers $4_1$-$4_L$ in multiple separate portions, greatly increasing the necessary number of test cycles.

SUMMARY OF THE INVENTION

An object of the present invention is to provide a memory test circuit that can test a memory having a greater data width than the width of the test processor's data bus without increasing the number of test cycles.

A memory test circuit according to the present invention is interposed between a processing unit and a memory having a greater data width than the processing unit. The memory test circuit includes a data expander and a data divider. The data expander expands write data received from the processing unit from the data width of the processing unit to the data width of the memory, for writing into the memory. The data divider divides data read from the memory into portions having the data width of the processing unit and supplies these portions sequentially to the processing unit.

The data expander may expand the write data by, for example, copying one or more specific bits of the write data to other bit positions. Some of the copied bits may be inverted to produce, for example, a checkerboard pattern. The data expander may also perform an arithmetic operation on the write address to generate additional bits of write data.

DETAILED DESCRIPTION OF THE INVENTION

Figure 1:
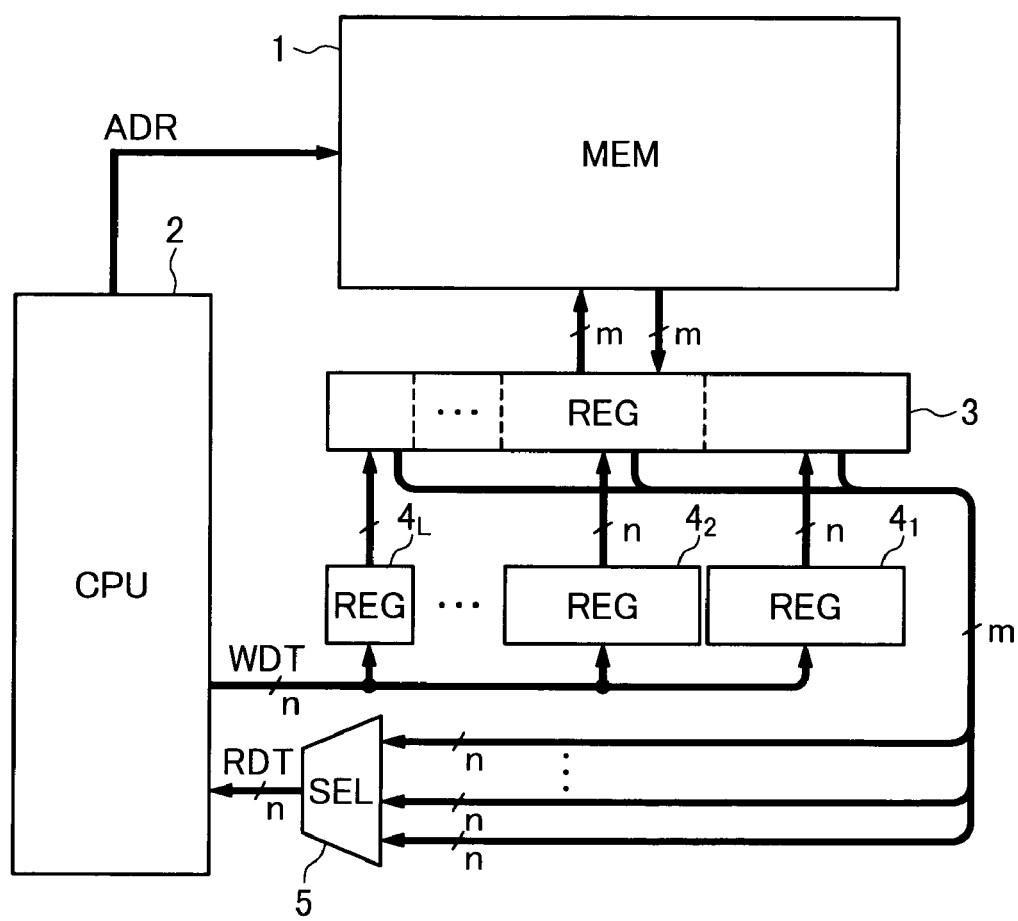
FIG. 1 is a block diagram illustrating a conventional memory test circuit.

Embodiments of the invention will now be described with reference to the attached drawings, in which like elements are indicated by like reference characters.

First Embodiment

Figure 2:
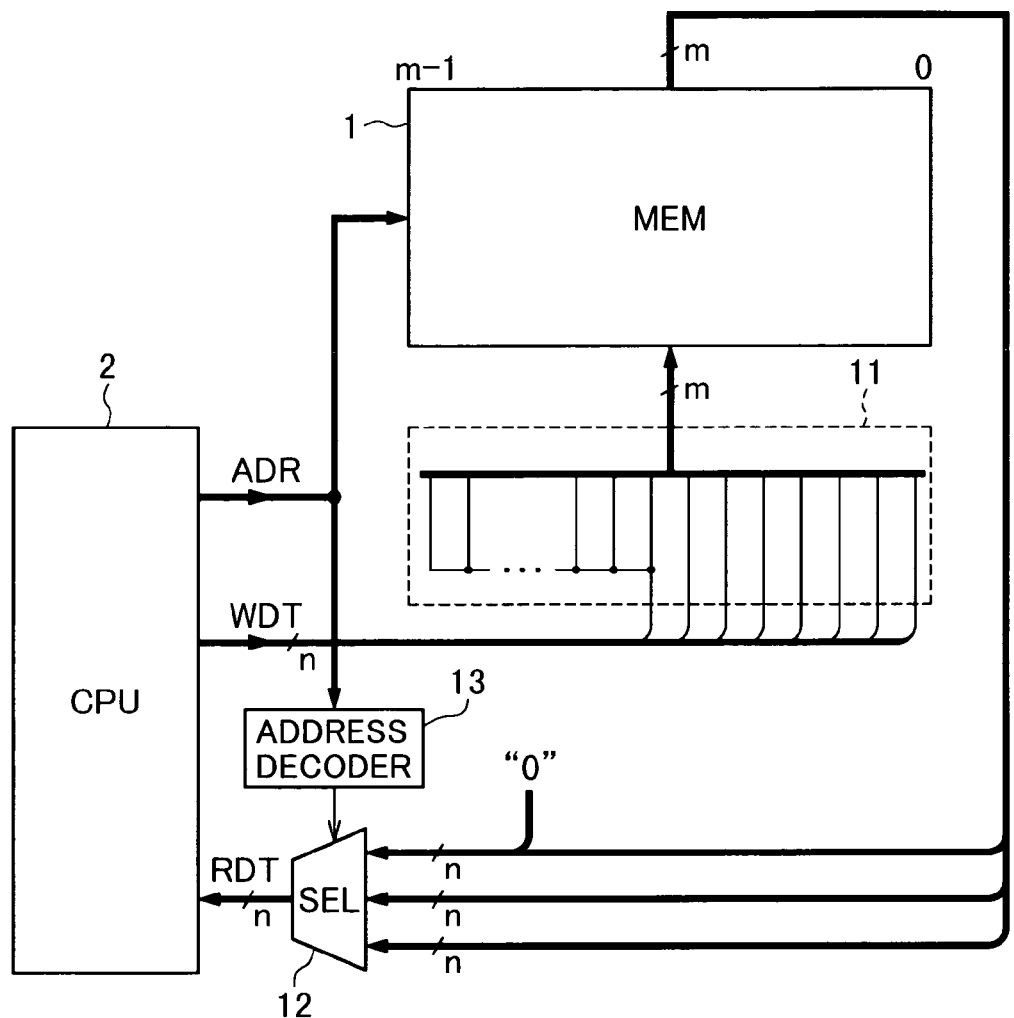
FIG. 2 is a block diagram illustrating a memory test circuit according to a first embodiment of the invention.

Referring to FIG. 2, in the first embodiment, a memory (MEM) 1 having an m-bit data width is tested by a CPU 2 having an n-bit data width (m>n). A bit extender 11 enables the CPU 2 to write m bits of data into the memory 1 in a single operation. A selector (SEL) 12 and an address decoder 13 enable data read from the memory 1 to be supplied to the CPU 2 in n-bit portions. The selector 12 and address decoder 13 constitute the data divider, while the bit extender 11 constitutes the data expander.

The bit extender 11 expands n bits of write data WDT, which are output from the CPU 2 on its data bus, to m bits of data by outputting the n bits of write data WDT to the n low-order bit positions (bit 0 to bit n−1), and outputting the most significant of these n bits (bit n−1) to all higher-order bit positions (bit n to bit m−1). The m bits of expanded data are supplied to the data input terminals of the memory 1.

The selector 12 divides m bits of the data output from the data output terminals of the memory 1 into L n-bit portions, and supplies the n-bit portions of data separately to the CPU 2 as read data RDT. If m is not an integer multiple of n, the m-bit data may be padded with additional '0' bits, for example, at the high-order end to adjust the size of each portion of read data RDT to n bits.

The address decoder 13 decodes the high-order bits of an address signal ADR output from the CPU 2, and generates a select signal for the selector 12. Although the address signal ADR basically specifies a read or write access area in the memory 1, further high-order bits are added to the address signal ADR as a signal controlling selection by the selector 12, in addition to the bits required for specification of the memory area in the memory 1.

Next, the operation of this memory test circuit will be described, taking as an example a memory test performed by the marching cubes algorithm.

(Step 1) All '0' bits are written from the CPU 2 into all addresses in the memory 1. Since all n bits of the write data WDT output from the CPU 2 are '0', all m bits of the expanded data produced in the bit extender 11 are also '0'. These m bits of '0' data are written in the memory 1. Accordingly, the number of cycles required for step 1 is equal to the number of words in the memory 1. This number will be denoted 'k' below.

(Step 2) The following processes (A) and (B) are repeated in order from the lowest address to the highest address in the memory 1.

(A) One m-bit word is read from the specified address in the memory 1 and divided into n-bit portions by the selector 12. The n-bit portions are supplied one by one to the CPU 2, which checks that all n bits are '0'.

(B) As the check of each address is completed, all '1' bits are written into the address.

Since for each word, the number of cycles required is L for process (A) and 1 for process (B), the number of cycles required for step 2 is (L+1)k.

(Step 3) The following processes (C) and (D) are repeated in order from the highest address to the lowest address.

(C) One m-bit word is read from the specified address in the memory 1 and divided into n-bit portions by the selector 12. The n-bit portions are supplied one by one to the CPU 2, which checks that all n bits are '1'.

(D) As the check of each address is completed, all '0' bits are written into the address.

Since for each word, the number of cycles required is L for process (C) and the 1 for process (D), the number of cycles required for step 3 is (L+1)k.

(Step 4) Steps 1-3 are repeated, reversing the values of the data written into the memory 1.

The total number of test cycles required for the processes in steps 1-4 is 2(2L+3)k. This is less than half the number of test cycles required by the conventional memory test circuit in FIG. 1. The exact ratio of the numbers or test cycles is (2L+3)/(5L+5).

As described above, the memory test circuit in the first embodiment includes a bit extender 11 that expands the write data WDT received from the CPU 2 from the n-bit data width of the CPU 2 to the m-bit data width of the memory 1 by extending the most significant bit, and supplies the expanded data to the memory 1. The memory test circuit has the advantage of enabling a CPU to test a memory having a greater data width than the width of the CPU data bus without increasing the number of test write cycles.

Second Embodiment

Figure 3:
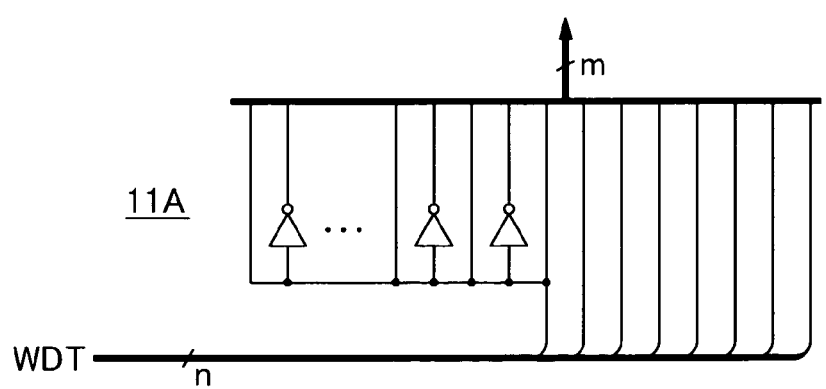
FIG. 3 is a block diagram illustrating a bit expander according to a second embodiment of the invention.

Referring to FIG. 3, in the second embodiment, the bit extender 11 in FIG. 2 is replaced with a bit expander 11A for use in a checker pattern memory test. In this type of test, different values ('0' and '1') are written into neighboring memory cells in the cell matrix of the memory cell array. The test is referred to as a checker pattern test because the layout of the data on the memory cell array creates a checkerboard pattern.

The bit expander 11A expands the n-bit write data WDT supplied from the CPU 2 to m-bit data by copying the most significant bit as in the first embodiment, but inverts the copied-bits in alternate bit positions, starting with the lowest-order copied bit (bit n). The m-bit expanded data are supplied to the data input terminals of the memory 1.

Next, the operation of a checker pattern memory test performed with the memory test circuit having the bit expander 11A will be described. As in the first embodiment, k is the number of m-bit words in the memory 1, and L is the least integer equal to or greater than m/n.

(Step 1) For all addresses, the CPU 2 outputs n-bit data alternating between '0' and '1' at successive bit positions. The value of each bit also alternates between '0' and '1' at successive addresses, to create a checkerboard pattern of data in the memory 1. Since the bit expander 11A continues the same alternating pattern in the higher order bit positions (bit n to bit m−1), the m bits of expanded data also create a checkerboard pattern when written in the memory 1. The number of cycles required is k for the process in step 1.

(Step 2) One m-bit word is read from a specified address in the memory 1 and divided into n-bit portions by the selector 12. The n-bit portions are supplied one by one to the CPU 2, which checks whether the n bits have the correct pattern. This process is repeated in order from the lowest address to the highest address in the memory 1. The number of cycles required is Lk for the process in step 2.

(Step 3) Steps 1 and 2 are repeated, reversing the values of the data written into the memory 1.

The total number of test cycles required for the processes in steps 1-3 is 2(L+1)k. This is half the number of test cycles that would be required by the conventional memory test circuit in FIG. 1.

As described above, the bit expander 11A in the second embodiment expands write data WDT received from the CPU 2 from the n-bit data width of the CPU 2 to the m-bit data width of the memory 1 by creating a pattern that alternates between '0' and '1' from bit n−1 to bit m−1, and supplies the expanded data to the memory 1. The advantages of the second embodiment in the checker pattern test are similar to the advantages of the first embodiment in the marching cubes test.

In a variation of the second embodiment, bit (n−1) is copied to the odd-numbered high-order bit positions (n+1, n+3, . . . ) and bit (n−2) is copied to the even-numbered high-order bit positions (n, n+2, . . . ), eliminating the need for the inverters shown in FIG. 3.

Third Embodiment

Figure 4:
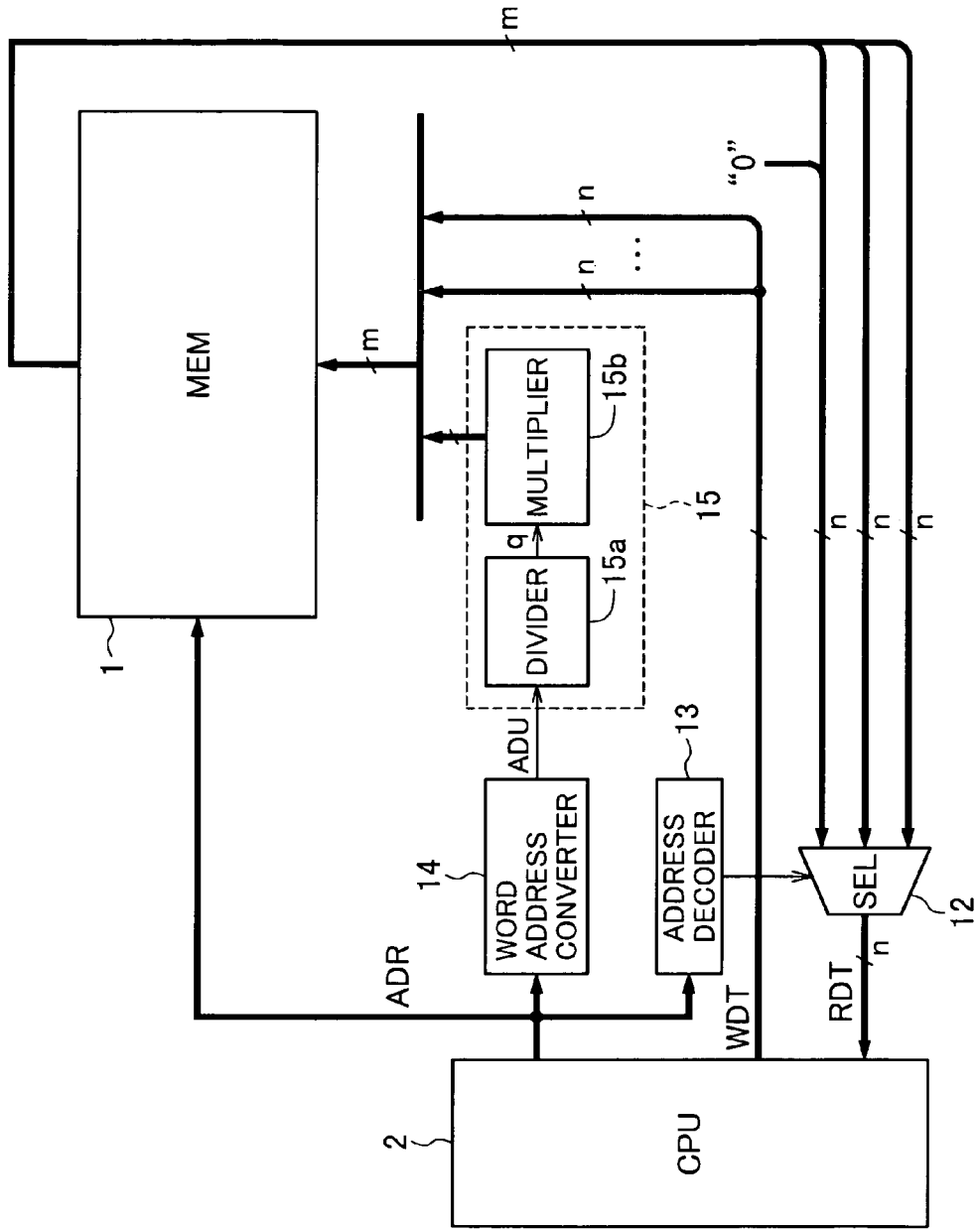
FIG. 4 is a block diagram illustrating a memory test circuit according to a third embodiment of the invention.

Referring to FIG. 4, in the third embodiment, the memory test circuit is used to expand a diagonal test pattern. The data expander includes a word address converter 14 and a diagonal pattern generator 15 instead of the bit extender 11 in FIG. 2. The diagonal pattern is a pattern of '1' bits forming a plurality of diagonal lines on the memory cell array, with '0' bits in other positions.

The word address converter 14 discards the low-order bits of the address signal ADR output from the CPU 2 to generate an address signal ADU designating an m-bit word line in the memory 1. The output side of the word address converter 14 is connected to the diagonal pattern generator 15.

The lower n(L−1) bits of each word of the expanded diagonal pattern are obtained by concatenating (L−1) copies of the n-bit write data WDT output by the CPU 2.

The diagonal pattern generator 15 includes a divider 15a and multiplier 15b that generate the remaining r high-order bits of each word, where r=m−n(L−1). The divider 15a divides the address signal ADU by r, discards the quotient, and outputs the remainder q. If m is not an integer multiple of n, the number r is equal to the remainder when m is divided by n. The multiplier 15b (actually an exponentiator) generates r bits of data in which the q-th bit is set to '1' and the other bits are '0', indicating the q-th power of two.

The r high-order bits of data output from the multiplier 15b are concatenated to the n(L−1) bits of low-order data obtained by duplicating the write data WDT output from the CPU 2 to create an m-bit word that is supplied to the data input terminals of the memory 1. The '1' bits output by the CPU 2 and multiplier 15b shift one bit position to the left at each successive address, returning to the original bit position at every n-th address in the lower bit positions and at every r-th address in the upper bit positions, creating a diagonal pattern.

Next, the diagonal pattern memory test in this memory test circuit will be described. As in the first embodiment, k is the number of words in the memory 1, and L is the least integer equal to or greater than m/n.

(Step 1) The CPU 2 generates n-bit diagonal test pattern data for all word addresses. This pattern is expanded by repetition to an n(L−1)-bit diagonal test pattern, and further expanded by the diagonal pattern generator 15 to create an m-bit diagonal test pattern, which is written a word at a time into the memory 1. The number of cycles required is k for the process in step 1.

(Step 2) One m-bit word is read from a specified address in the memory 1 and divided into n-bit portions by the selector 12. The n-bit portions are supplied one by one to the CPU 2, which checks whether the n bits have the correct pattern. This process is repeated in order from the lowest address to the highest address in the memory 1. The number of cycles required is Lk for the process in step 2.

The total number of test cycles required for the processes in steps 1 and 2 is (L+1)k. This is half the number of the test cycles that would be required by the conventional memory test circuit in FIG. 1.

As described above, the memory test circuit in the third embodiment expands the n-bit diagonal test pattern generated by the CPU 2 to n(L−1) bits by repetition, and concatenates further diagonal test pattern data of width r to create m-bit diagonal test pattern data matching the m-bit data width of the memory 1. The advantages of the memory test circuit in the third embodiment in the diagonal test are similar to the advantages of the first embodiment in the marching cubes test.

The invention is not restricted to the embodiments described above; numerous variations are possible, three examples of which are described below.

(a) Although the write data WDT output from the CPU 2 are used for the n lower bit positions of the m-bit test patterns in FIGS. 2 and 3, if the marching cubes algorithm or a simple pattern such as a checker pattern is used, the memory test circuit can generate the entire m-bit test pattern on command from the CPU 2.

(b) Although the diagonal pattern bits output from the CPU 2 as write data WDT in FIG. 4 were only supplemented by the diagonal pattern bits generated in the diagonal pattern generator 15, the diagonal pattern generator can be modified to create an entire m-bit diagonal pattern.

(c) Although the memory test circuits shown in FIGS. 2, 3, and 4 are useful in memory tests performed by the marching cubes algorithm, the checker pattern, and the diagonal pattern, memory test circuits that are similarly useful for memory tests with other test patterns can be obtained by modifying the bit extender 11, the bit expander 11A, or the word address converter 14 and diagonal pattern generator 15.

As described in detail above, the memory test circuit according to the invention includes a data expander that expands write data received from the processing unit from the data width of the processing unit to the data width of the memory, so that an m-bit word of test data can be written into the memory each time the CPU 2 outputs n bits of test data. The number of write cycles required for testing the memory therefore remains the same, no matter how large the data width (m) of the memory may be.

Those skilled in the art will recognize that further variations are possible within the scope of the invention, which is defined in the appended claims.

What is claimed is:

1. A memory test circuit enabling a processing unit having a first data width to test a memory having a second data width greater than the first data width, comprising:

a data expander for expanding data received from the processing unit from the first data width to the second data width and writing the expanded data into the memory, the data expander including a diagonal pattern generator for creating diagonal test pattern data, the data expander copying the data received from the processing unit to a first set of bit positions and placing the diagonal test pattern data generated by the diagonal pattern generator in a second set of bit positions including a number of bits equal to a first remainder obtained by dividing the second data width by the first data width; and a data divider for reading the expanded data from the memory, dividing the expanded data read from the memory into portions of the first data width, and supplying these portions sequentially to the processing unit;

wherein the data expander makes multiple copies of the data received from the processing unit.

* * * * *